United States Patent
Park et al.

(10) Patent No.: US 7,592,222 B2
(45) Date of Patent: Sep. 22, 2009

(54) METHOD OF FABRICATING FLASH MEMORY DEVICE

(75) Inventors: Eun Shil Park, Namyangju-si (KR); Kwon Hong, Seongnam-si (KR); Jae Hong Kim, Seongnam-si (KR); Jae Hyoung Koo, Seoul (KR)

(73) Assignee: Hynix Semiconductor Inc., Icheon-Si (KR)

( * ) Notice: Subject to any disclaimer, the term of this patent is extended or adjusted under 35 U.S.C. 154(b) by 0 days.

(21) Appl. No.: 12/147,178

(22) Filed: Jun. 26, 2008

(65) Prior Publication Data

US 2009/0163015 A1    Jun. 25, 2009

(30) Foreign Application Priority Data

Nov. 22, 2007    (KR)  ............... 10-2007-0119658

(51) Int. Cl.
*H01L 21/336*    (2006.01)

(52) U.S. Cl. .................. 438/257; 438/197; 438/232; 438/259; 438/261; 438/264; 438/788; 438/792; 257/E21.21; 257/E21.68

(58) Field of Classification Search .............. 438/260, 438/265
See application file for complete search history.

(56) References Cited

U.S. PATENT DOCUMENTS 5,536,667 A * 7/1996 Cho ........................ 438/591
6,969,886 B1 * 11/2005 Park et al. ................ 257/324

FOREIGN PATENT DOCUMENTS

KR    10-2005-0030330    3/2005
KR    10-0678640    1/2007

* cited by examiner

*Primary Examiner*—N Drew Richards
*Assistant Examiner*—Kyoung Lee
(74) *Attorney, Agent, or Firm*—Marshall, Gerstein & Borun LLP

(57) ABSTRACT

The present invention relates to a method of fabricating a flash memory device. According to a method of fabricating a flash memory device in accordance with an aspect of the present invention, a semiconductor substrate over which a tunnel insulating layer and a first conductive layer are formed is provided. A first oxide layer is formed on the first conductive layer using a plasma oxidization process in a state where a back bias voltage is applied. A nitride layer is formed on the first oxide layer. A second oxide layer is formed on the nitride layer. A second conductive layer is formed on the second oxide layer.

14 Claims, 2 Drawing Sheets

METHOD OF FABRICATING FLASH MEMORY DEVICE

CROSS-REFERENCES TO RELATED APPLICATION

The present application claims priority to Korean patent application number 10-2007-0119658, filed on Nov. 22, 2007, which is incorporated by reference in its entirety.

BACKGROUND OF THE INVENTION

The present invention relates to a method of fabricating a flash memory device and, more particularly, to a method of fabricating a flash memory device, in which, in a state where a back bias voltage is applied, an oxide layer of a dielectric layer is formed using a plasma oxidization process.

In general, non-volatile memory devices retain data stored therein when power is off. A unit cell of this non-volatile memory device includes a tunnel insulating layer, a floating gate, a dielectric layer, and a control gate all of which are sequentially stacked over an active area of a semiconductor substrate. The unit cell can store data as voltage from the outside to a control gate electrode is coupled to the floating gate. Thus, if it sought to store data at a low program voltage within a short period of time, the ratio of voltage applied to the control gate electrode and voltage induced to the floating gate has to be great.

The ratio of voltage applied to the control gate electrode and voltage induced to the floating gate is called a coupling ratio. The coupling ratio can be expressed by the ratio of the sum of capacitance of a tunnel insulating layer and a gate interlayer insulating layer and the sum of capacitance of the gate interlayer insulating layer.

In recent years, with the high integration of devices and the decreasing cell size, the capacitance of a dielectric layer, having a stacked layer of oxide-nitride-oxide (ONO), decreases and the coupling ratio is reduced. Due to this, in order to ensure the coupling ratio, the thickness of the dielectric layer has been decreased. However, if the thickness of the dielectric layer reduces, the leakage current increases and a charge retention characteristic is reduced, degrading the characteristics of devices.

In particular, the ONO dielectric layer is deposited using a dichlorosilane (DCS) or monosilane (MS)-based chemical vapor deposition (CVD) method. The oxide layer or the nitride layer formed by this CVD method has a film quality lower than that of an oxide layer formed by a typical dry or wet oxidization process and has a low step coverage characteristic of 85% or less. Recently, as the thickness of the dielectric layer decreases so as to ensure the coupling ratio because of the high-integrated devices, the leakage current and reliability characteristic are degraded. Consequently, there is a need for a method with excellent step coverage.

BRIEF SUMMARY OF THE INVENTION

The present invention is directed towards a method of fabricating a flash memory device. A dielectric layer, having a stacked structure of an oxide layer, a nitride layer, and an oxide layer, may be formed using a plasma oxidization process in a state where a back bias voltage is applied to at least one oxide layer. A result is that a step coverage characteristic and a film quality characteristic can be improved, while forming a thick oxide layer. Therefore a dielectric layer with high performance and high reliability can be formed.

According to a method of fabricating a flash memory device in accordance with an aspect of the present invention, a semiconductor substrate over which a tunnel insulating layer and a first conductive layer are formed may be provided. A first oxide layer may be formed on the first conductive layer using a plasma oxidization process in a state where a back bias voltage is applied. A nitride layer may be formed on the first oxide layer. A second oxide layer may be formed on the nitride layer. A second conductive layer may be formed on the second oxide layer.

When the back bias voltage is applied, a radio frequency (RF) bias voltage of 50 W to 600 W may be applied.

The plasma oxidization process may be performed in a temperature range of 400 degrees Celsius to 600 degrees Celsius under a pressure of 0.5 Torr to 5.0 Torr.

The plasma oxidization process may be performed under $O_2$ atmosphere.

The second oxide layer may be formed using a plasma oxidization process in a state where the back bias voltage for forming the first oxide layer is applied.

The first conductive layer may be formed of a doped polysilicon layer.

The nitride layer may be formed using a chemical vapor deposition (CVD) method.

The CVD method may be performed in a temperature range of 600 degrees Celsius to 800 degrees Celsius under a pressure of 0.1 Torr to 5.0 Torr. The CVD method is performed under $NH_3$ atmosphere.

The CVD method may be performed using dichlorosilane (SiH2Cl2) gas.

According to a method of fabricating a flash memory device in accordance with another aspect of the present invention, a semiconductor substrate on which a stacked layer of a tunnel insulating layer and a first conductive layer is formed is provided. A first oxide layer may be formed on the first conductive layer. A nitride layer may be formed on the first oxide layer. A second oxide layer may be formed on the nitride layer. A second conductive layer may be formed on the second oxide layer. At least one of the first oxide layer and the second oxide layer may be formed using a plasma oxidization process in a state where a back bias voltage is applied.

When the back bias voltage is applied, a RF bias voltage of 50 W to 600 W is applied.

The plasma oxidization process is performed in a temperature range of 400 degrees Celsius to 600 degrees Celsius under a pressure of 0.5 Torr to 5.0 Torr.

The plasma oxidization process may be performed under $O_2$ atmosphere.

DESCRIPTION OF SPECIFIC EMBODIMENT

Now, specific embodiments of the present invention will be described with reference to the accompanying drawings. However, the present invention is not limited to the disclosed embodiments, but may be implemented in various ways. The embodiments are provided to complete the disclosure of the present invention and to allow those having ordinary skill in the art to understand the scope of the present invention. The present invention is defined by the category of the claims.

FIGS. 1A to 1E are sectional views illustrating a method of fabricating a flash memory device in accordance with embodiments of the present invention.

Figure 1A:
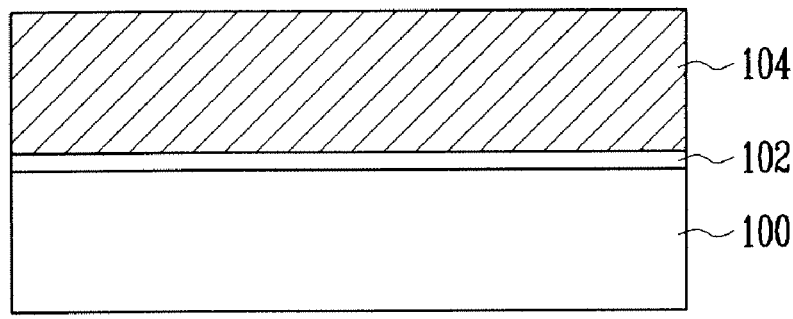
FIGS. 1A to 1E are sectional views showing illustrating a method of fabricating a flash memory device in accordance with an embodiment of the present invention.

Referring to FIG. 1A, a semiconductor substrate 100 in which a well area (not shown) is formed is provided. The well area can have a triple structure. The well area is formed by forming a screen oxide layer (not shown) on the semiconductor substrate 100 and then performing a well ion implantation process and a threshold voltage ion implantation process.

After the screen oxide layer is removed, a tunnel insulating layer 102 is formed on the semiconductor substrate 100 in which the well area is formed. The tunnel insulating layer 102 can be formed of a silicon oxide ($SiO_2$) layer. In this case, the tunnel insulating layer 102 can be formed using an oxidation process.

A first conductive layer 104 is formed on the tunnel insulating layer 102. The first conductive layer 104 is used as a floating gate of the flash memory device and can be formed of a doped polysilicon layer.

The first conductive layer 104 is patterned in one direction (a bit line direction) using an etch process employing a mask (not shown). After an exposed portion of the tunnel insulating layer 102 is etched, the portion of the semiconductor substrate 100 exposed by the etching is etched to a specific depth, thus forming trenches (not shown) in an isolation area. Insulating material is deposited on the first conductive layer 104, including the trenches, so that the trenches are gap-filled. The deposited insulating material is polished, so isolation layers (not shown) are formed only within the trenches. At this time, a photoresist pattern may be used as the mask. Here, the photoresist pattern can be formed by coating photoresist on the first conductive layer 104 and patterning the photoresist using exposure and development processes.

Figure 1B:
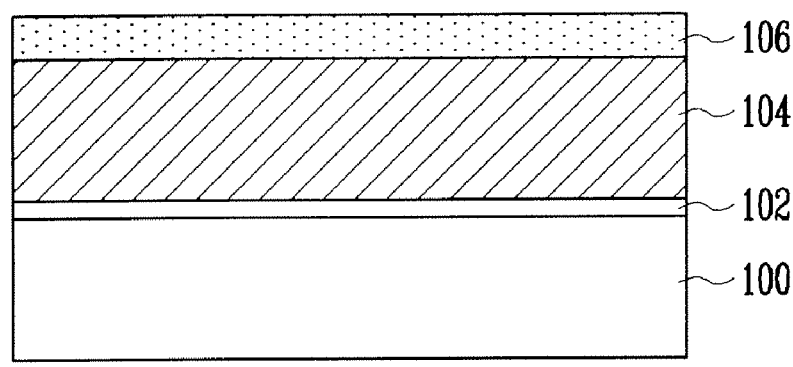

Referring to FIG. 1B, a first oxide layer 106 is formed on the patterned first conductive layer 104 and the isolation layers. The first oxide layer 106 is used as a lower layer of a dielectric layer of the flash memory device and can be formed by oxidizing the surface of the first conductive layer 104 using a plasma oxidization process.

In particular, the plasma oxidization process is performed in a state where a back bias voltage is applied to a surface of the first conductive layer 104 made of the doped polysilicon layer, unlike an existing plasma process. In this case, the back bias voltage can include a radio frequency (RF) bias voltage of 50 W to 600 W. The plasma oxidization process is performed in a temperature rang of 400 degrees Celsius to 600 degrees Celsius under a pressure of 0.5 Torr to 5.0 Torr under $O_2$ atmosphere. Accordingly, the first oxide layer 106 is formed into a silicon oxide ($SiO_2$) layer.

As described above, if the back bias voltage is applied when the plasma oxidization process is performed, ions existing in the plasma state are accelerated by the back bias voltage and have a high reactivity, so that a thick oxide layer can be formed under the same condition as a thin oxide layer is formed without application of the back bias voltage. Accordingly, in an embodiment of the present invention, the first oxide layer 106 having a relatively thick thickness, which would not be obtained in an existing plasma process, can be formed. If the back bias voltage is applied when the plasma oxidization process is performed, conditions for an oxidization process are satisfied although hydrogen ($H_2$) is not added. Accordingly, not only there is an advantage in that an oxidization rate can be ensured, but also stable device characteristics can be ensured since characteristic degradation of devices due to $H_2$ is prevented.

Further, the first oxide layer 106 formed by the plasma oxidization process can have an excellent step coverage characteristic and uniformity when compared with an oxide layer employing a CVD method.

In addition, since the plasma process is performed at a temperature of 600 degrees Celsius or less, the first oxide layer 106 having a high density can be formed without thermal degradation.

Figure 1C:
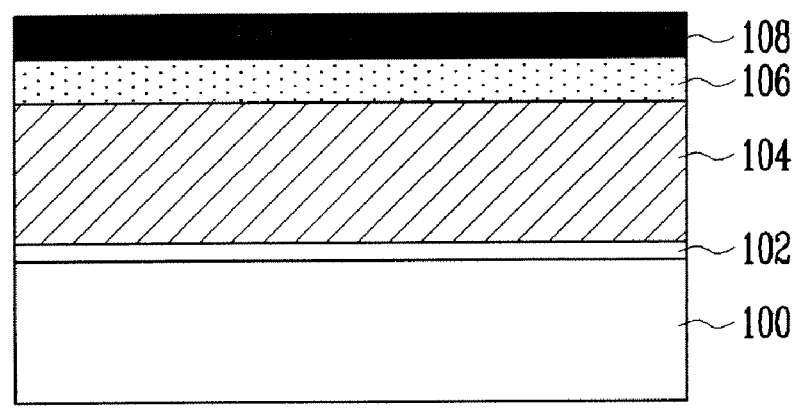

Referring to FIG. 1C, a nitride layer 108 is formed on the first oxide layer 106. The nitride layer 108 is used as an intermediate layer of the dielectric layer of the flash memory device. Here, the nitride layer 108 can be formed of a silicon nitride ($Si_3N_4$) layer. At this time, the nitride layer 108 can be formed using a CVD method. Here, the CVD method can be performed in a temperature range of 600 degrees Celsius to 800 degrees Celsius under a pressure of 0.1 Torr to 0.5 Torr. Further, the CVD method can be performed using $SiH_2C_{l2}$ (dichlorosilane gas) under $NH_3$ atmosphere.

Figure 1D:
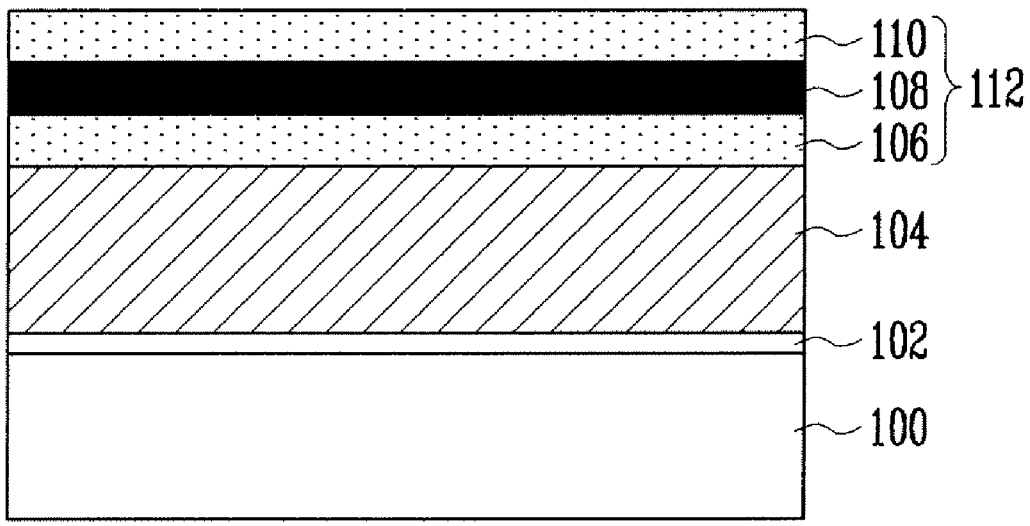

Referring to FIG. 1D, a second oxide layer 110 is formed on the nitride layer 108. The second oxide layer 110 is used as an upper layer of the dielectric layer of the flash memory device. The second oxide layer 110 is formed by oxidizing the nitride layer 108 in a specific ratio using a plasma oxidization process.

In particular, the plasma oxidization process is performed in a state where a back bias voltage is applied to a surface of the nitride layer 108 made of the doped polysilicon layer, unlike an existing plasma process. In this case, the back bias voltage can include a RF bias voltage of 50 W to 600 W. The plasma oxidization process is performed in a temperature range of 400 degrees Celsius to 600 degrees Celsius under a pressure of 0.5 Torr to 5.0 Torr under $O_2$ atmosphere. Accordingly, the second oxide layer 110 is formed into a silicon oxide ($SiO_2$) layer.

As described above, if the back bias voltage is applied when the plasma oxidation process is performed, the second oxide layer 110 having a thick thickness, which would not be obtained in an existing plasma process that does not use a back bias voltage, can be formed. Further, since hydrogen ($H_2$) is not added, degradation of device characteristics due to $H_2$ can be prevented while ensuring a rapid oxidization rate. Accordingly, stable device characteristics can be accomplished. In addition, the second oxide layer 110 formed by the plasma oxidization process can have an excellent step coverage characteristic and uniformity when compared with an oxide layer employing a CVD method.

In addition, since the plasma process is performed at a temperature of 600 degrees Celsius or less, the second oxide layer 110 having a high density can be formed without thermal degradation.

As described above, the dielectric layer 112 includes the first and second oxide layers 106, 110, which are relatively thick in thickness, have a high-density thin film characteristic, an excellent step coverage characteristic and uniformity, and can prevent degradation of characteristics. Accordingly, a leakage current, breakdown voltage, cycling, and charge retention characteristics, etc. of the dielectric layer can be improved. Consequently, device characteristics of the dielectric layer 112 can be further improved and, therefore, flash memory devices with high performance and high reliability can be fabricated.

Figure 1E:
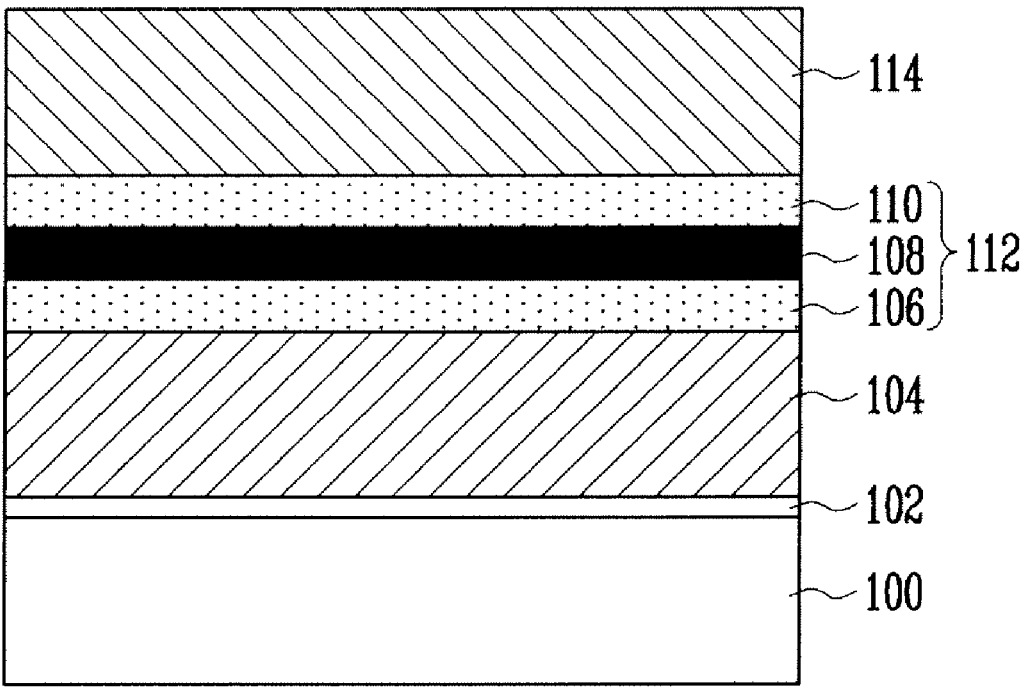

Referring to FIG. 1E, a second conductive layer 114 is formed on the second oxide layer 110. The second conductive layer 114 is used as a control gate of the flash memory device. The second conductive layer 114 can be a polysilicon layer, a metal layer or a stacked layer of them. The second conductive layer 114 can be preferably formed of a polysilicon layer.

Although not shown in the drawings, the second conductive layer 114, the dielectric layer 112, and the first conductive layer 104 may be patterned using a typical etch process, thus forming a floating gate comprised of the first conductive layer 104 and a control gate comprised of the second conductive layer 114. At this time, a gate pattern, having a stacked structure of the tunnel insulating layer 102, the floating gate, the dielectric layer 112, and the control gate, is formed. Thereafter, a subsequent process is performed to thereby complete the flash memory device.

The present invention has the following advantages.

First, a dielectric layer having a stacked layer of an oxide layer, a nitride layer, and an oxide layer is formed using a plasma oxidization process in a state where the back bias voltage is applied. Thus, an oxide layer having a thick thickness, which would not be obtained in an existing plasma process not using a back bias voltage, can be formed under the same condition. Further, since hydrogen ($H_2$) is not used, degradation of device characteristics due to $H_2$ can be prevented while ensuring a rapid oxidization rate.

Second, since the oxide layer is formed using the plasma oxidization process, a step coverage characteristic and uniformity can be improved.

Third, since the oxide layer is formed using the plasma oxidization process at a temperature of 600 degrees Celsius or less, a film quality with a high density can be formed without thermal degradation and therefore stable device characteristics can be accomplished.

Fourth, leakage current, breakdown voltage, cycling, and charge retention characteristics, etc. of the dielectric layer can be improved. Accordingly, device characteristics of the dielectric layer can be further improved.

Fifth, since the device characteristics of the dielectric layer are improved, flash memory devices with high performance and high reliability can be fabricated.

The embodiment disclosed herein has been proposed to allow a person skilled in the art to easily implement the present invention, and the person skilled in the part may implement the present invention in various ways. Therefore, the scope of the present invention is not limited by or to the embodiment as described above, and should be construed to be defined only by the appended claims and their equivalents.

What is claimed is:

1. A method of fabricating a flash memory device, the method comprising:
    providing a semiconductor substrate on which a stacked layer of a tunnel insulating layer and a first conductive layer is formed;
    forming a first oxide layer on the first conductive layer using a plasma oxidization process in a state where a back bias voltage is applied to a surface of the first conductive layer;
    forming a nitride layer on the first oxide layer;
    forming a second oxide layer on the nitride layer; and
    forming a second conductive layer on the second oxide layer.

2. The method of claim 1, wherein when the back bias voltage is applied, a radio frequency (RF) bias voltage of 50 W to 600 W is applied.

3. The method of claim 1, wherein the plasma oxidization process is performed in a temperature range of 400 degrees Celsius to 600 degrees Celsius under a pressure of 0.5 Torr to 5.0 Torr.

4. The method of claim 1, wherein the plasma oxidization process is performed under O2 atmosphere.

5. The method of claim 1, wherein the second oxide layer is formed using a plasma oxidization process in a state where the back bias voltage for forming the first oxide layer is applied.

6. The method of claim 1, wherein the first conductive layer is formed of a doped polysilicon layer.

7. The method of claim 1, wherein the nitride layer is formed using a chemical vapor deposition (CVD) method.

8. The method of claim 7, wherein the CVD method is performed in a temperature range of 600 degrees Celsius to 800 degrees Celsius under a pressure of 0.1 Torr to 5.0 Torr.

9. The method of claim 7, wherein the CVD method is performed under NH3 atmosphere.

10. The method of claim 7, wherein the CVD method is performed using dichlorosilane ($SiH_2Cl_2$) gas.

11. A method of fabricating a flash memory device, the method comprising:
    providing a semiconductor substrate on which a stacked layer of a tunnel insulating layer and a first conductive layer is formed;
    forming a first oxide layer on the first conductive layer;
    forming a nitride layer on the first oxide layer;
    forming a second oxide layer on the nitride layer; and
    forming a second conductive layer on the second oxide layer,
    wherein at least one of the first oxide layer and the second oxide layer is formed using a plasma oxidization process in a state where a back bias voltage is applied to at least one of surfaces of the first conductive layer and the nitride layer.

12. The method of claim 11, wherein when the back bias voltage is applied, a radio frequency (RF) bias voltage of 50 W to 600 W is applied.

13. The method of claim 11, wherein the plasma oxidization process is performed in a temperature range of 400 degrees Celsius to 600 degrees Celsius under a pressure of 0.5 Torr to 5.0 Torr.

14. The method of claim 11, wherein the plasma oxidization process is performed under $O_2$ atmosphere.

* * * * *